United States Patent
Robertson et al.

(12) United States Patent (10) Patent No.: US 6,658,530 B1
(45) Date of Patent: Dec. 2, 2003

(54) HIGH-PERFORMANCE MEMORY MODULE (75) Inventors: William L. Robertson, Newark, CA (US); Drew G. Doblar, San Jose, CA (US); Steven C. Krow-Lucal, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 46 days.

(21) Appl. No.: 09/687,202

(22) Filed: Oct. 12, 2000

(51) Int. Cl.[7] ............................................. G06F 12/00
(52) U.S. Cl. ........................ 711/115; 711/101; 365/52; 365/53
(58) Field of Search ................. 711/115, 5; 365/51–53, 365/185, 33, 230.03; 439/92, 101, 680

(56) References Cited

U.S. PATENT DOCUMENTS

| | | | |
|---|---|---|---|
| 4,917,616 A | * | 4/1990 | Demler et al. ............... 439/101 |
| 4,975,084 A | * | 12/1990 | Fedder et al. ............... 439/108 |
| 5,270,964 A | * | 12/1993 | Bechtolsheim et al. ....... 365/52 |
| 5,430,859 A | * | 7/1995 | Norman et al. .......... 365/185.33 |
| 5,726,863 A | * | 3/1998 | Nakayama et al. .......... 174/255 |
| 5,790,447 A | * | 8/1998 | Laudon et al. .......... 365/230.03 |
| 5,829,036 A | * | 10/1998 | Klein .......................... 711/115 |
| 6,160,716 A | * | 12/2000 | Perino et al. ................ 174/250 |
| 6,172,895 B1 | * | 1/2001 | Brown et al. ................... 365/52 |
| 6,347,039 B1 | | 2/2002 | Lee |
| 6,353,539 B1 | | 3/2002 | Horine et al. |
| 6,402,566 B1 | * | 6/2002 | Middlehurst et al. ........ 439/680 |
| 6,414,868 B1 | | 7/2002 | Wong et al. |
| 6,457,155 B1 | | 9/2002 | Dell et al. |

\* cited by examiner

*Primary Examiner*—Matthew Kim
*Assistant Examiner*—Zhuo H. Li
(74) *Attorney, Agent, or Firm*—Meyertons Hood Kivlin Kowert & Goetzel, P.C.; B. Noël Kivlin (57) ABSTRACT

A high-performance memory module. The memory module is designed for a computer system with a wide data path. The memory module is implemented using a small printed circuit board (PCB), with a plurality of memory chips and a connector mounted upon the PCB. Signal traces for control, address, and data signals are arranged in such a manner as to minimize the length of each signal trace, thereby saving PCB area. On the connector, an electrical ground pin is located between each pair of signal pins, which may allow for a low-resistance return current path, and may therefore allow the module to operate at higher clock frequencies. Furthermore, locating a ground pin between each pair of signal pins may help reduce signal interference, or "crosstalk", thereby improving signal integrity of the memory module.

17 Claims, 8 Drawing Sheets

HIGH-PERFORMANCE MEMORY MODULE

BACKGROUND OF THE INVENTION

1. Field of the Invention

This invention is related to memory subsystems, and more particularly, to add-in memory modules for expanding the amount of memory in a computer system.

2. Description of the Related Art

The demand for more memory in computer systems is ever increasing. This is true for all levels within the memory hierarchy, including registers (within a microprocessor core), cache memory, main memory, and disk storage. Similar to the demand for more memory is the demand for greater speed in processing information. There are several methods for increasing the speeds of computer systems, including implementing faster clock speeds for new microprocessors and system buses. Other methods for increasing the speed of computer systems involve architectural changes, which may be implemented in the design phase of a computer system. One such method is to increase the size of the data bus. Increasing the size of the data bus may allow newer computers to process more information per clock cycle than older computers with smaller data buses. For example, a computer with a 32-bit data bus may be able to process twice as much information per clock cycle as a computer with a 16-bit data bus.

The speed of computer systems may also be increased by implementing larger memories. One such type of memory, as listed above, is a cache memory. A cache is a small memory within a computer system interposed between the registers of a microprocessor and main memory (i.e. random access memory, or RAM). Cache memories may be used to store frequently accessed instructions and/or data. In general, a microprocessor may access these instructions and/or data from a cache memory much faster than from main memory. Cache memories may be divided into hierarchies. For example, an L1 (Level One) cache is typically located nearer to a processor core (thus allowing faster access) than an L2 (Level Two) cache. Often times, an L1 cache will be implemented directly on a microprocessor die, while an L2 cache will be implemented via memory chips separate from the microprocessor. In some instances, a cache memory that is not implemented directly upon a microprocessor die may be upgradeable. In some computer systems, for example, an L2 cache may be implemented in a memory module that may be coupled to a computer system through a connector. This may allow the size of the L2 cache to be increased at a relatively low cost, and may result in a significant performance increase.

In most cases, an increase in the size of either cache memory or main memory will result in a performance gain by a computer system. Typically, the performance gain will be more noticeable when the size of cache memory is increased, although significant performance gains may be realized by increasing main memory as well.

As previously stated, increasing the size of a data bus and the clock speed of a computer system are two other methods of obtaining higher performance. However, these methods may have an adverse impact on the performance of memory modules. Memory modules are typically implemented using small circuit boards with limited area for signal traces. Implementing a larger data bus can present significant difficulties in designing a circuit board for a memory module intended for such computer systems. In addition to traces for data signals, area must be reserved for traces necessary to convey address and control signals to the chips on the module.

Increasing the clock speed of a computer system may present other difficulties. One such difficulty is related to signal integrity. Typically, as the speed of operation increases, the potential for interference between the various signals (sometimes referred to as "crosstalk") may also increase. Such crosstalk may induce errors into signal lines on a memory module or computer motherboard. In some cases, an error correction subsystem may be able to correct these errors. However, typical error correction subsystems are limited in the number of simultaneous errors they may detect and/or correct. Uncorrected errors may often times lead to undesirable operation of a computer system. Memory modules operating at higher clock speeds with large data bus widths may be especially susceptible to errors induced by crosstalk.

SUMMARY OF THE INVENTION

The problems outlined above are in large part solved by a high performance memory module in accordance with the present invention. In one embodiment, a memory module is produced for use with a computer system having a wide data path (i.e. data bus), such as 144 bits. The memory module may include a plurality of memory chips mounted upon a printed circuit board. A connector is mounted to the printed circuit board for conveying data, address, and control signals between the memory module and the computer system. Signal traces for address signals, which are common to a majority (if not all) memory chips of the module may be routed such that they are located near the center of the connector. By keeping signal traces for the address signals near the center of the connector, their length may be minimized, thereby conserving circuit board area. Conversely, signal traces for data signals may be routed such that they are near the peripheries of the connector. Typically, a given data signal will be specific to only one memory chip of the module. By arranging the data pins in this manner, they may be kept relatively close to the corresponding memory chip.

In various embodiments, signal integrity issues may be addressed by the design of the memory module. In such embodiments, the connector used in the module design includes two rows of signal pins. A plurality of blades is arranged between the rows of signal pins for providing the required power to the memory module. Within each row of signal pins is located a plurality of pins coupled to an electrical ground. In one embodiment, most signal pins (but not all) are located directly adjacent to a ground pin. The large number of ground pins may improve signal integrity by minimizing or eliminating crosstalk between signal pins. The extra number of ground pins may also provide a low resistance current return path from the module to the system ground. This may allow the memory module to operate at higher clock frequencies.

The memory module may, depending on its design, be used to expand cache memories or main memories. Embodiments employing SRAM's (Static Random Access Memories) may be used to expand a cache memory, such as an L2 cache. Similarly, embodiments employing DRAM's (Dynamic Random Access Memories) may be used to expand the capacity of a main memory subsystem.

Thus, in various embodiments, the high-performance memory module may allow the expansion of either cache memory or main memory. The use of a connector with a large number of ground pins may allow the module to operate at higher frequencies while preserving the integrity of the various control, address, and data signals conveyed between the module and a computer system. Furthermore, by keeping the address pins centrally located on the connector, circuit board area may be more efficiently utilized.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined be the appended claims.

DETAILED DESCRIPTION OF THE INVENTION

Figure 1A:
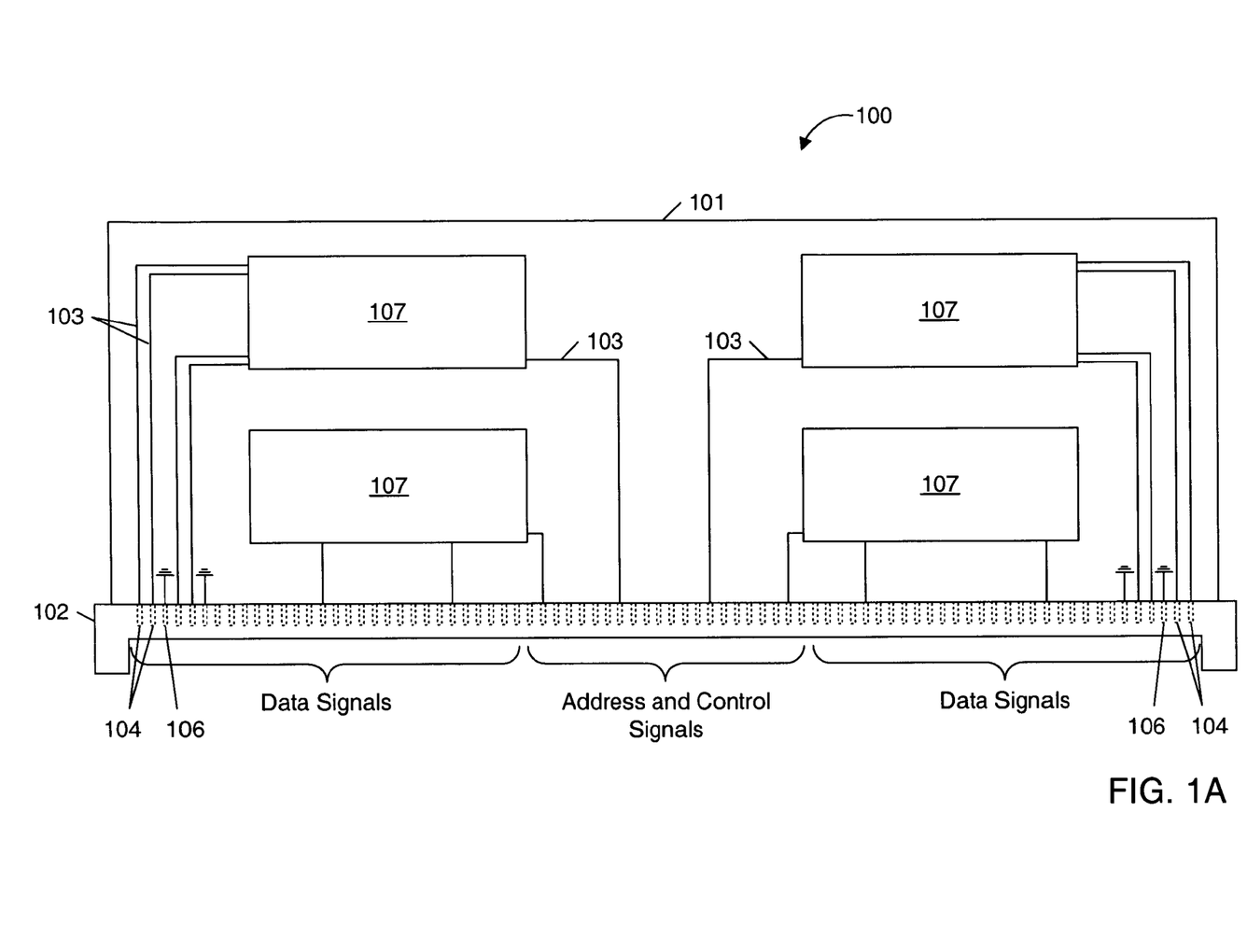
FIG. 1A is a mechanical drawing of top side of one embodiment of a memory module.

Turning now to FIG. 1A, a mechanical drawing of the top side of one embodiment of a memory module is shown. Memory module 100 includes a printed circuit board (PCB) 101 and a connector 102. Connector 102 includes a plurality of signal pins, each of which is electrically coupled to a signal trace 103. Signal pins 104 of connector 102 are arranged in rows. Connector 102 also includes a plurality of power blades arranged between the rows of signal pins for providing electrical power to the module (this will be discussed in further detail below). Connector 102 is configured to allow memory module 100 to be coupled to a computer system. Signal traces 103 provide a signal path between the individual signal pins of memory chips 107 and signal pins 104 of connector 102. Located between each pair of signal pins 104 is an electrical ground pin 106, which is connected to a ground plane of PCB 101. The high number of electrical ground pins 106 may provide a low resistance path for return currents from the memory module, which may thereby allow the module to operate at higher clock frequencies. Furthermore, the large number of electrical ground pins may help reduce interference, or "crosstalk", between signal pins, which is typically a greater problem at higher clock frequencies. Thus, memory module 100 may be able to operate at higher clock frequencies with good signal integrity.

Signal traces 103 are arranged on PCB 101 in order to minimize the length of each trace. To this end, address and control signals, which are typically common to multiple memory chips 107 of the memory module, are centrally located with respect to connector 102. This may help minimize the length of signal traces for address and control signals. Conversely, each data signal is typically unique to a specific memory chip. As such, signal traces 103 for data signals are arranged towards the peripheries of connector 102 in order to help minimize their length. Minimizing the length of the signal traces may preserve circuit board area, and thus allow for greater signal densities (and hence, a larger data bus, such as 144 bits in one embodiment. It is noted that some signal traces may be located in part on different signal layers of PCB 101, instead of the surface layer. In general, PCB 101 includes a power layer, an electrical ground layer, and a plurality of signal layers.

Memory chips 107 may be either static random access memory (SRAM) or dynamic random access memory (DRAM) chips. Embodiments of memory module 100 which are intended for the expansion of a cache memory may utilize SRAM chips, while embodiments intended for the expansion of main memory may utilize DRAM chips.

Figure 1B:
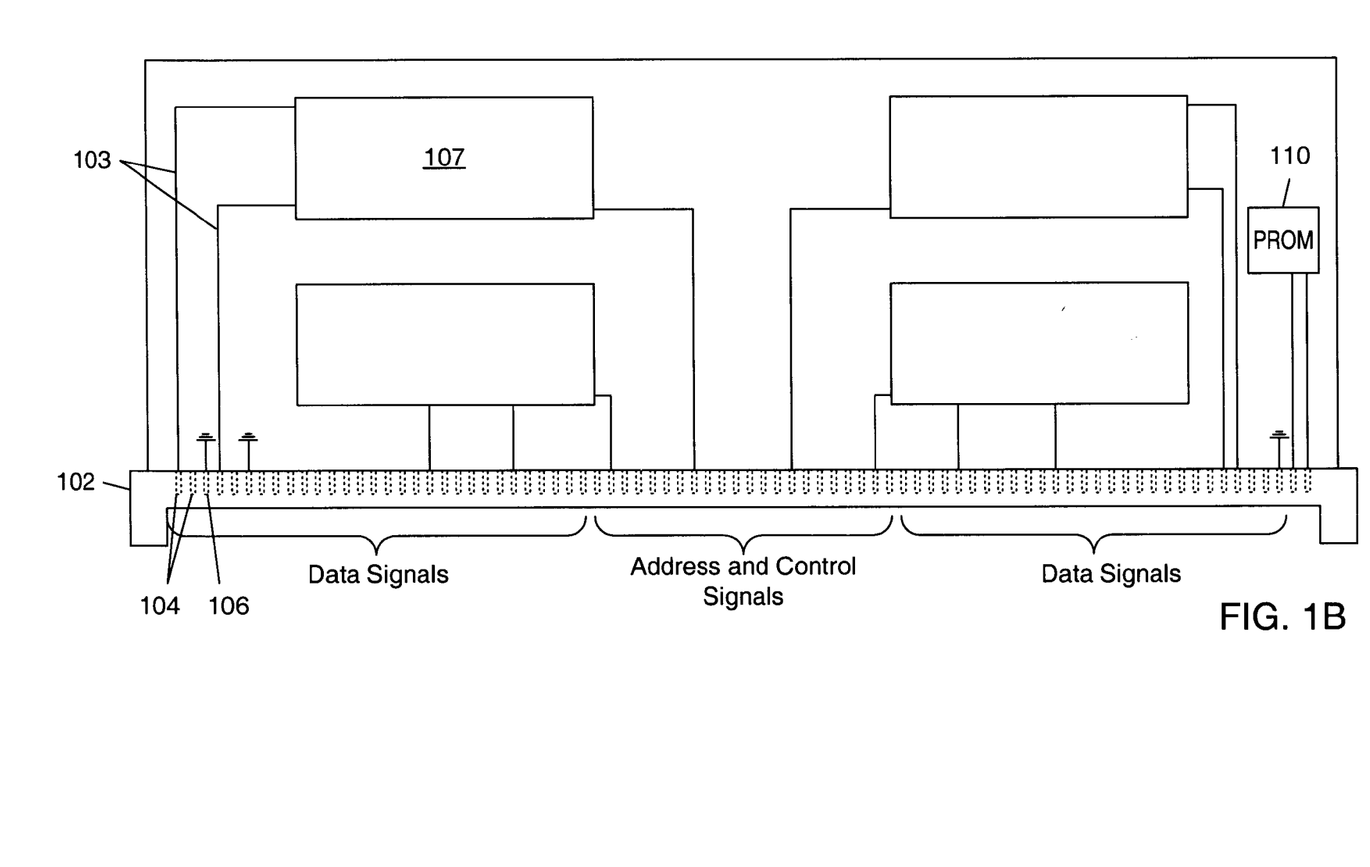
FIG. 1B is a mechanical drawing of the bottom side of one embodiment of the memory module.

FIG. 1B is a mechanical drawing of the bottom side of one embodiment of memory module 100. Included on the bottom side of memory module 100 is a programmable read-only memory, PROM 110. PROM 110 may be used to provide module identification information. Module identification information may include date and location of manufacture. The information stored in PROM 110 may be useful for failure analysis in the event of a field failure. Memory module 100 may also have a plurality of memory chips mounted on the bottom side in some embodiments, although other embodiments may include memory chips on one side only.

Figure 2A:
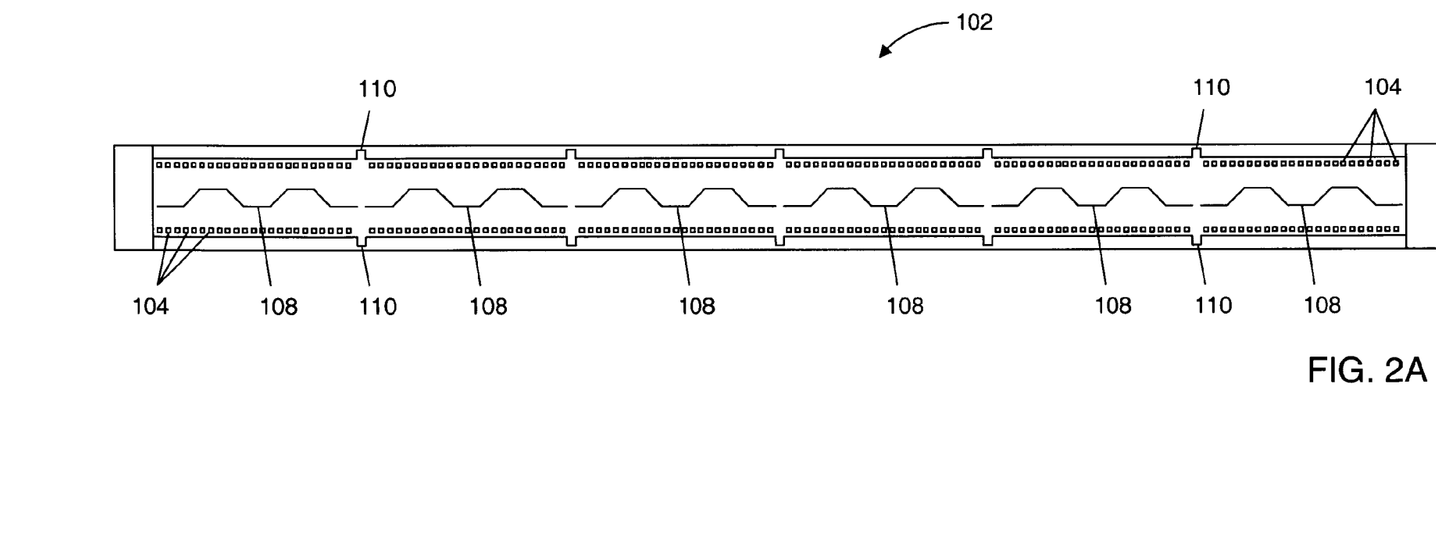
FIG. 2A is a mechanical drawing of a front view the connector used in one embodiment of the memory module.

Moving now to FIG. 2A, a mechanical drawing of a front view of one embodiment of connector 102 is shown. Connector 102 includes two rows of signal pins 104. Some signal pins within each row may be separated by notches 110. In the embodiment shown, notches 110 have an approximate width of 1/32. Each row of signal pins includes connections to electrical ground as shown in FIG. 1A. Power is provided to the memory module through power blades 108, which are located between the rows of signal pins 104. In one embodiment power blades 108 couple directly to a power plane PCB 101 through power pins, which will be illustrated in further detail below. In one embodiment, connector 102 is configured to couple all necessary control, address, and data signals, as well as system power and ground, from a computer motherboard to a PCB of the memory module.

Figure 2B:
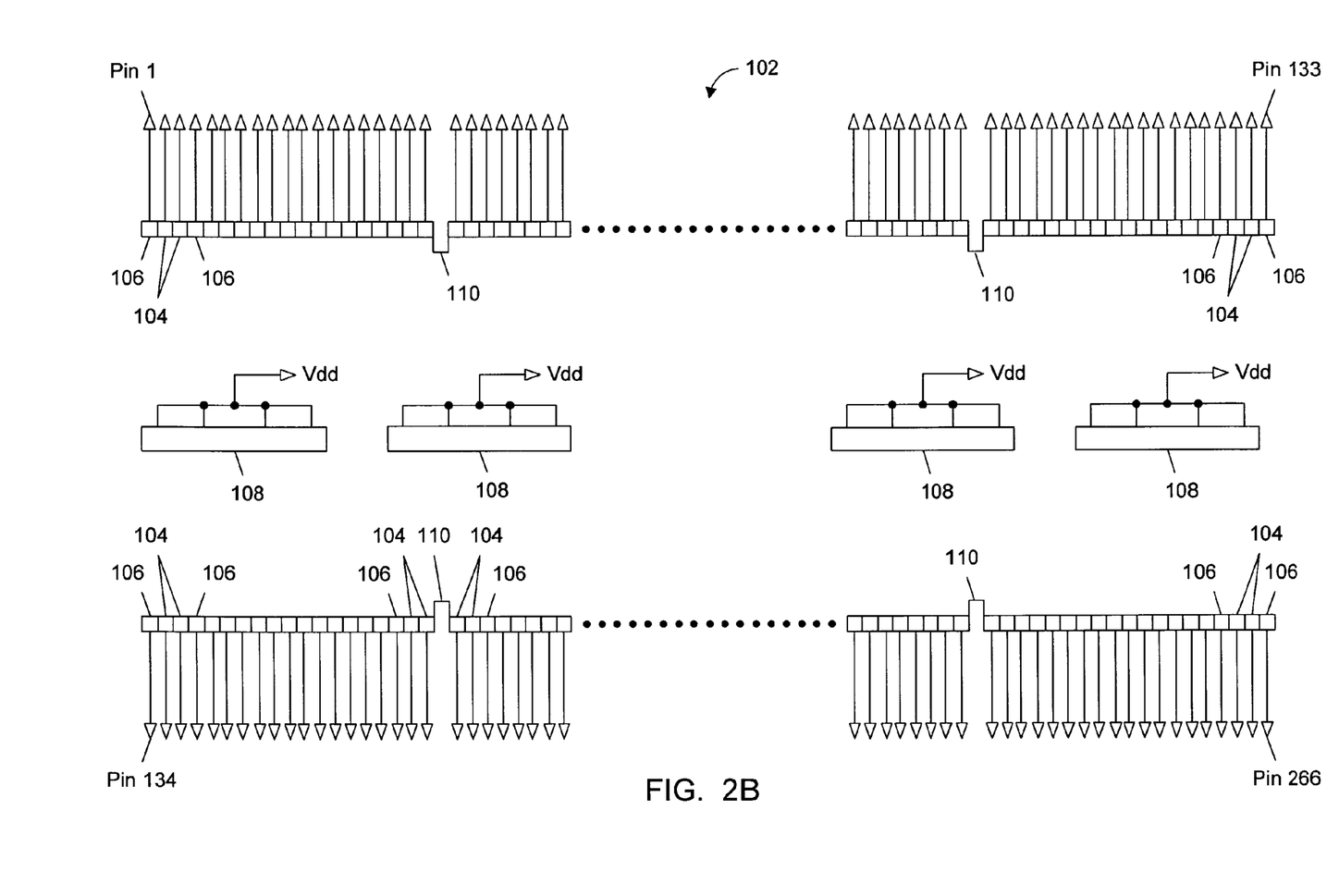
FIG. 2B is a signal assignment diagram of the connector pin arrangement for one embodiment of the memory module.

FIG. 2B is a signal assignment diagram of the connector pin arrangement for one embodiment of the memory module. In the embodiment shown, connector 102 includes two rows of pins, with 133 pins in each row. Thus, this embodiment of connector 102 includes a total of 266 pins. Power blades 108 are arranged between the rows of pins. Signal pins 104 may convey signals to and from the memory module. In general, signal pins 104 are arranged in groups. Ground pins 106 are arranged between groups of signal pins 104. In many cases, though not all, two signal pins 104 may be arranged between a pair of ground pins, particularly in groups of contiguous pins between notches 110. In other cases, more than two signal pins 104 may be located between a pair of ground pins 106, such as in those areas on either side of notches 110. Typically, in the areas on either side of notches 110, three or four signal pins may be arranged between a pair of ground pins, with one ground pin of the pair on each side of the notch. The embodiment shown includes a total of 86 ground pins, with 43 ground pins in each row. The embodiment also includes 128 pins for conveying data signals, 8 pins for carrying error correction signals, 19 pins for address signals, and 19 pins for various other signals (such as clock signals and signals for the PROM described above). The high number of ground pins relative to other signal pins allows for a higher current return path, which may enable the memory module to operate at higher frequencies. Furthermore, since a large number of signal pins are located adjacent to a ground pin, signal integrity may be improved, as the ground pins may be effective in eliminating signal interference (i.e. "crosstalk").

Figure 3A:
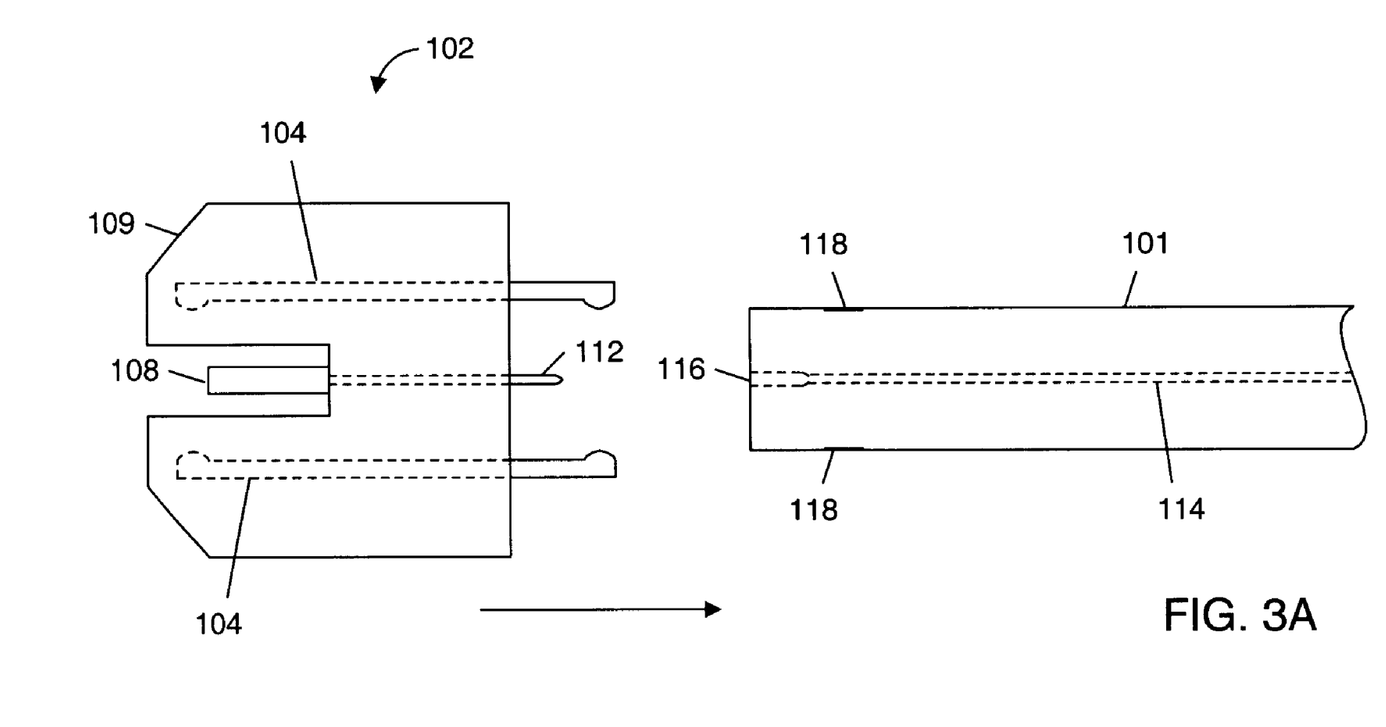
FIG. 3A is a mechanical drawing of a side view of the connector and printed circuit board used in one embodiment of the memory module.

FIG. 3A is a mechanical drawing of a side view of connector 102 and PCB 101 as employed in one embodiment of the memory module. Connector 102 includes two rows of signal pins 104, and a plurality of power blades 108 between the rows of signal pins. Power blades 108 are coupled to power pins 112, which extend from connector housing 109. Each power pin 112 may be inserted into an aperture 116 of PCB 101. Each aperture 116 is coupled to power plane 114, and thus provides an electrical connection between power blades 108 and the power plane. PCB 101 also includes a plurality of signal pads 118 for providing electrical connections to corresponding signal pins 104. When connector 102 is coupled to PCB 101, signal pins 104 may be soldered to signal pads 118.

Figure 3B:
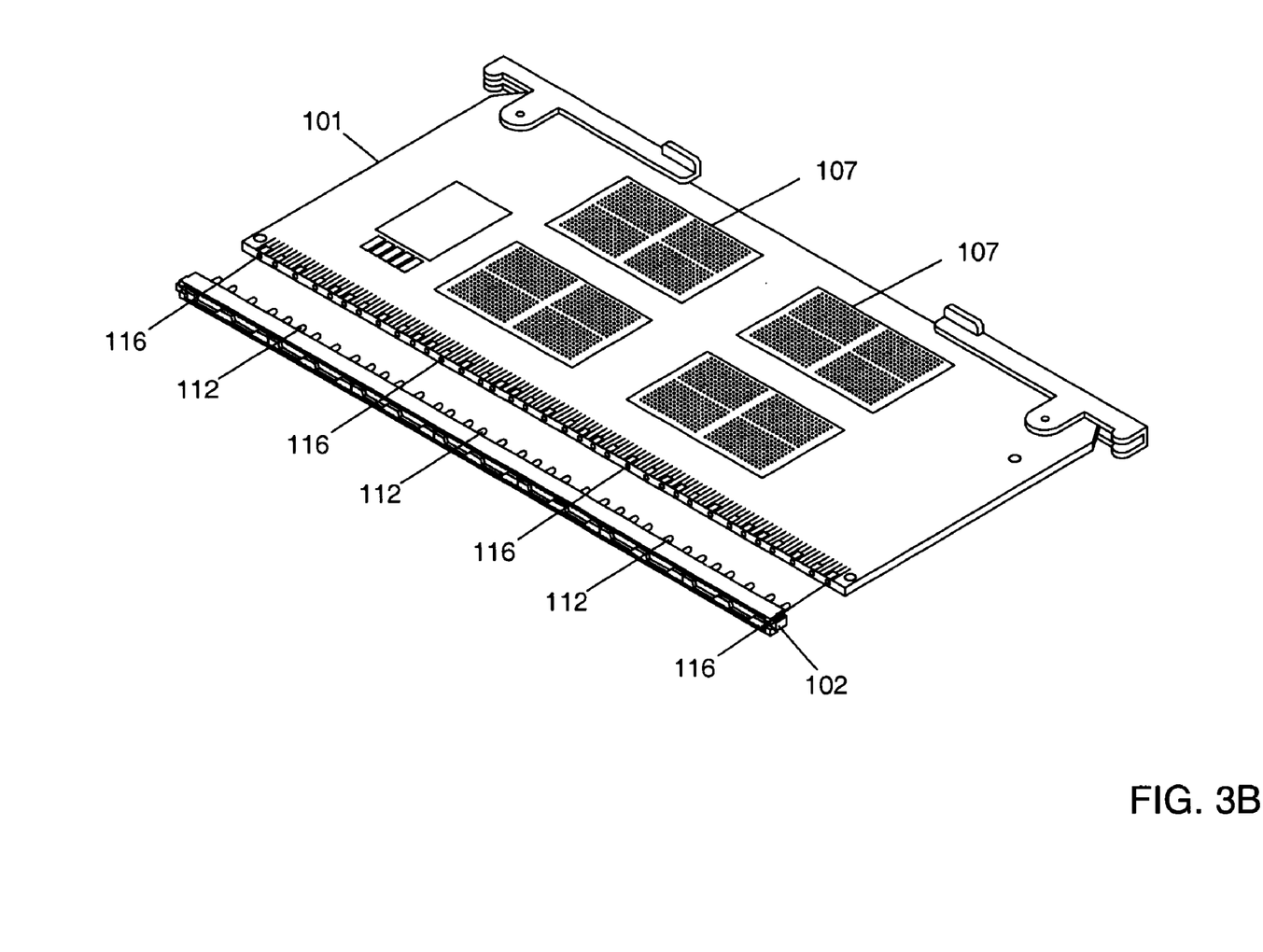
FIG. 3B is a perspective view of the connector and printed circuit board used in one embodiment of the memory module.

FIG. 3B is a perspective view of connector 102 and PCB 101 used in one embodiment of the memory module. As discussed in reference to FIG. 3A, connector 102 includes a plurality of power pins 112. Power pins 112 are configured to couple to a power plane of PCB 101 via a plurality of apertures 116 located on one edge of PCB 101.

Figure 4:
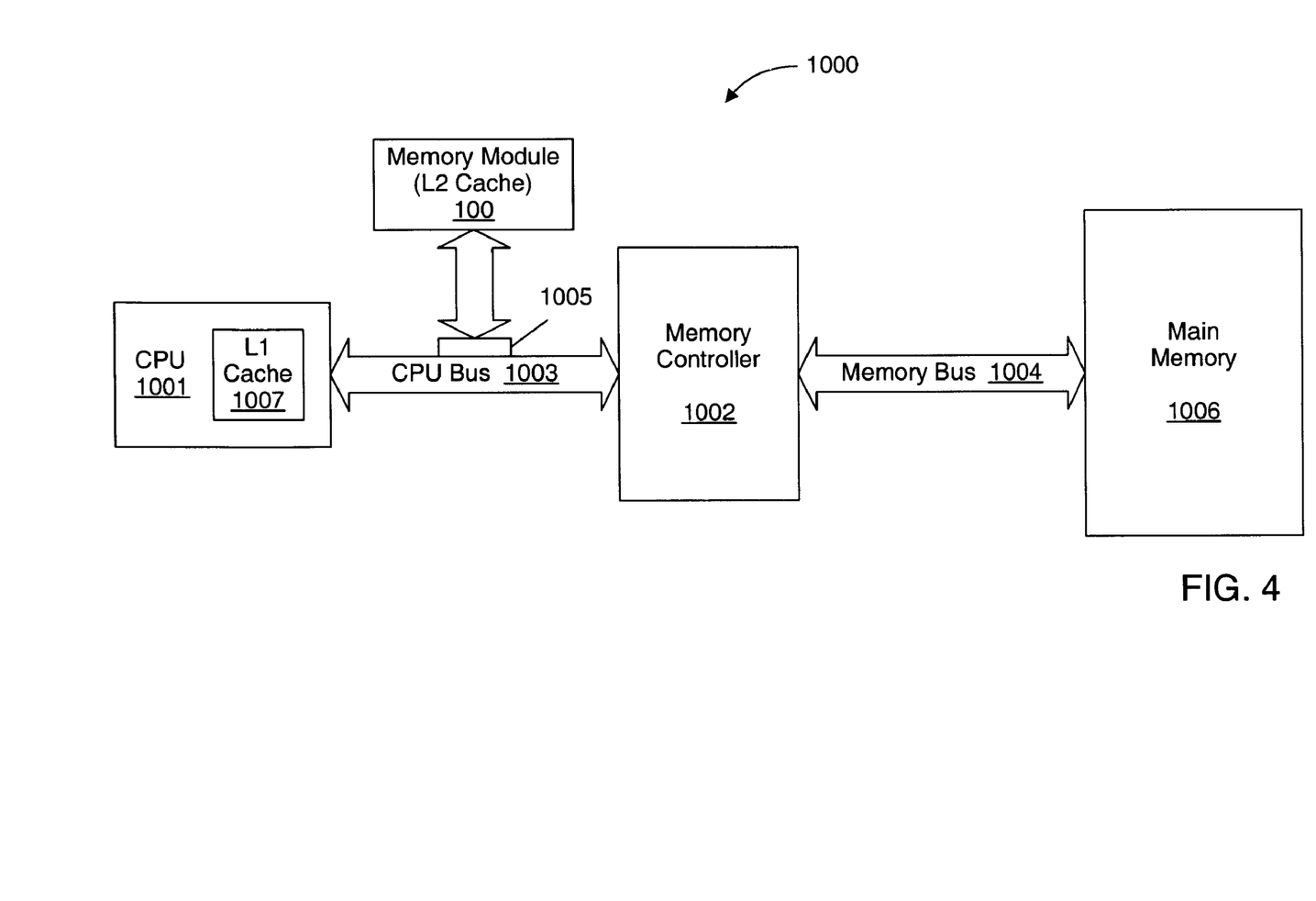
FIG. 4 is a block diagram of a computer system featuring one embodiment of the memory module that may be used to increase the amount of cache memory present; and, FIG. 5 is a block diagram of a computer system featuring one embodiment of the memory module that may be used to increase the amount of main memory present.

FIG. 4 is a block diagram illustrating the use of one embodiment of memory module 100 for increasing the amount of cache memory in computer system 1000. Computer system 1000 includes a central processing unit (CPU) 1001, CPU bus 1003, memory controller 1002, memory bus 1004, and main memory 1006. CPU 1001 includes a level-one (L1) cache 1007. L1 cache 1007 may be used by the computer system to store frequently accessed data and/or instructions. CPU bus 1003 includes connector socket 1005, which may allow the addition of a level-two (L2) cache. In this embodiment, the L2 cache is implemented in accordance with the foregoing description of memory module 100. A connector socket 1005 associated with CPU bus 1003 mates with connector 102 of memory module 100. When is inserted into connector socket 1005, memory module 100 provides computer system 1000 with a second level of cache memory. Similar to the L1 cache memory, the L2 cache memory may also store frequently accessed data and/or instructions. In most cases, the most frequently accessed data/instructions will be stored in the L1 cache.

Figure 5:
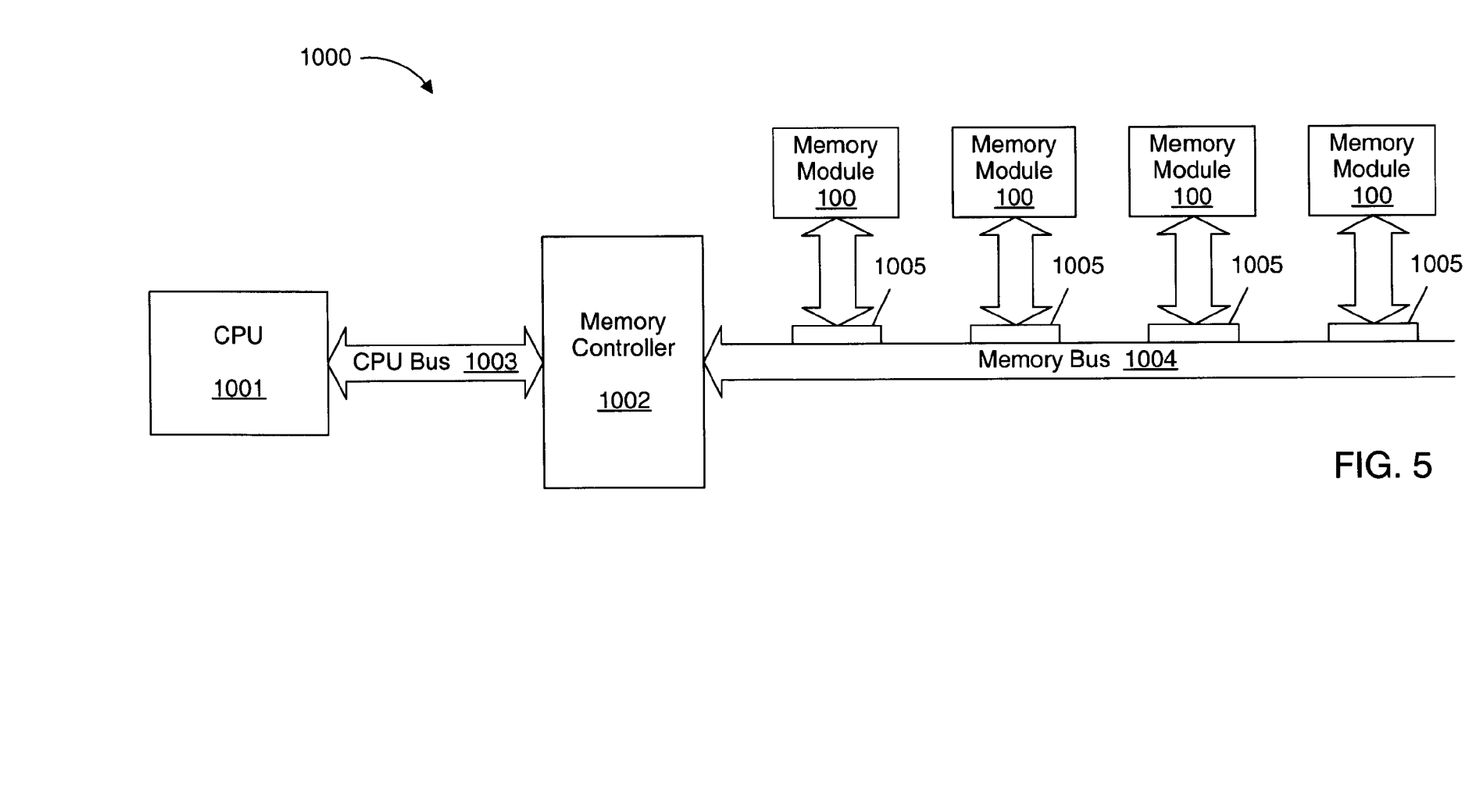

FIG. 5 is a block diagram illustrating the use of one embodiment of memory module 100 for increasing the amount of main memory in computer system 1000. In this embodiment, computer system 1000 includes a CPU 1001, memory controller 1002, a CPU bus 1003, and memory bus 1004. Memory bus 1004 includes a plurality of connector sockets 1005. Connectors located upon memory modules 100 may be inserted into these sockets, thereby coupling the memory modules to the memory bus. In the embodiment shown, memory modules 100 are used to expand the main memory of computer system 1000.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A memory module comprising:
   a printed circuit board (PCB);
   a plurality of memory chips mounted upon said printed circuit board,
   a connector mounted to said printed circuit board,
   wherein said connector includes rows of pins, and each row comprising groups of signal pins for conveying signals to corresponding signal lines of said PCB, and electrical ground pins being coupled to said PCB, wherein at least one of said electrical ground pins separates each group of said signal pins from another group of said signal pins in a same row, and wherein no more than four of said signal pins in each group lie between each pair of said electrical ground pins in the same row, respectively; and
   wherein said connector includes a plurality of power blades for providing power to said memory module, said power blades arranged between said rows of pins.

2. The memory module as recited in claim 1, wherein said connector includes at least 266 pins.

3. The memory module as recited in claim 1, wherein said memory module is an external cache memory.

4. The memory module as recited in claim 3, wherein said external cache memory is a level-two (L2) cache.

5. The memory module as recited in claim 1, wherein said memory chips are static random access memory (SRAM) chips.

6. The memory module as recited in claim 1, wherein said memory chips are dynamic random access memory (DRAM) chips.

7. The memory module as recited in claim 1, wherein said memory module is configured to be electrically coupled to a motherboard of a computer system.

8. The memory module as recited in claim 1 further comprising a PROM (programmable read-only memory) for providing module identification.

9. The memory module as recited in claim 1, wherein signal pins for conveying address and control signals are centrally located on said connector and signal pins for conveying data signals are located near the peripheries of said connector.

10. A computer system comprising:
    a central processing unit (CPU) including a level one (L1) cache memory;
    a CPU bus;
    a memory controller coupled to said CPU through said CPU bus;
    a memory bus coupled to said memory controller;
    a main memory subsystem coupled to said memory bus;
    at least one memory module coupled to said memory controller, wherein said memory module includes a plurality of memory chips mounted upon a printed circuit board (PCB) and a connector mounted to said PCB, and wherein said connector includes rows of pins and each row comprising groups of signal pins for conveying signals to and from corresponding signal traces of said PCB, and electrical ground pins being coupled to said PCB, wherein at least one of said electrical ground pins separates each group of said signal pins from another group of said signal pins in a same row, and wherein no more than four of said signal pins in each group lie between each pair of said electrical ground pins in the same row, respectively; and wherein said connector includes a plurality of power blades for providing power to said memory module, said power blades arranged between said rows of pins.

11. The computer system as recited in claim 10, wherein said connector includes at least 266 pins.

12. The computer system as recited in claim 10, wherein said memory module is configured to provide a level two (L2) cache memory.

13. The computer system as recited in claim 10, wherein said memory chips are static random access memory (SRAM) chips.

14. The computer system as recited in claim 10, wherein said memory module is configured to expand said main memory subsystem.

15. The computer system as recited in claim 14, wherein said memory chips are dynamic random access memory (DRAM) chips.

16. The computer system as recited in claim 10, wherein signal pins for conveying address and control signals are centrally located on said connector, and wherein signal pins for conveying data signals are located near the peripheries of said connector.

17. A memory module comprising:

a printed circuit board (PCB);

a plurality of memory chips mounted upon said printed circuit board; and a connector mounted to said printed circuit board, wherein said connector includes a first row of pins and a second row of pins, wherein the first row of pins and the second row of pins each comprises groups of signal pins couple to corresponding signal lines on said PCB, and electrical ground pins being coupled to said PCB, wherein at least one of said electrical ground pins separates each group of said signal pins from another group of said signal pins in a same row, and wherein no more than four of said signal pins lie between each pair of said electrical ground pins in the same row, respectively; and wherein said connector further includes a plurality of power blades for conveying power to said memory module, wherein said power blades are arranged between the first row of pins and the second row of pins.

\* \* \* \* \*

UNITED STATES PATENT AND TRADEMARK OFFICE
CERTIFICATE OF CORRECTION

PATENT NO. : 6,658,530 B1
DATED : December 2, 2003
INVENTOR(S) : Robertson et al.

It is certified that error appears in the above-identified patent and that said Letters Patent is hereby corrected as shown below:

Column 8,
Line 14, please replace "couple" with "coupled".

Signed and Sealed this

Twenty-second Day of June, 2004

JON W. DUDAS
*Acting Director of the United States Patent and Trademark Office*